United States Patent
McNitt et al.

(10) Patent No.: US 6,842,058 B2
(45) Date of Patent: Jan. 11, 2005

(54) METHOD AND APPARATUS FOR SLEW CONTROL OF AN OUTPUT SIGNAL

(75) Inventors: John L. McNitt, Fort Collins, CO (US); Russell E. Radke, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/292,262

(22) Filed: Nov. 12, 2002

(65) Prior Publication Data

US 2004/0090253 A1 May 13, 2004

(51) Int. Cl.[7] ................................. H03K 5/04
(52) U.S. Cl. .................... 327/170; 327/130; 326/27
(58) Field of Search ....................... 327/108, 112, 327/165, 170, 374, 376–377, 387, 130; 326/17, 26–27, 29, 83

(56) References Cited

U.S. PATENT DOCUMENTS

| | | | | |
|---|---|---|---|---|
| 3,772,533 A | * | 11/1973 | Bruckner et al. | 327/130 |
| 5,194,760 A | * | 3/1993 | Braun et al. | 327/110 |
| 5,414,382 A | * | 5/1995 | Larson et al. | 327/561 |
| 5,600,274 A | * | 2/1997 | Houston | 327/262 |
| 5,656,969 A | * | 8/1997 | Pulvirenti et al. | 327/561 |
| 5,742,193 A | * | 4/1998 | Colli et al. | 327/170 |
| 6,130,563 A | * | 10/2000 | Pilling et al. | 327/111 |
| 6,222,403 B1 | * | 4/2001 | Mitsuda | 327/170 |
| 6,271,699 B1 | * | 8/2001 | Dowlatabadi | 327/170 |
| 6,313,664 B1 | * | 11/2001 | Hall et al. | 326/83 |

* cited by examiner

Primary Examiner—Timothy P. Callahan
Assistant Examiner—Terry L. Englund (57) ABSTRACT

Systems and methods for enhancing slew control of output signals. An output driver receives an input signal and controllably increases the gain of that signal to provide a high quality output signal for use by an electronic device coupled thereto. The output driver includes an operational amplifier that maintains stability of the output signal through a feedback of the output signal. A control circuit supplies a signal to the output driver such that the driver to improve the shape of the output signal as the input signal is applied. After the operational amplifier regains control, the control circuit disengages. One embodiment of the present invention may be particularly useful as a USB output driver.

10 Claims, 4 Drawing Sheets

METHOD AND APPARATUS FOR SLEW CONTROL OF AN OUTPUT SIGNAL

BACKGROUND OF THE INVENTION

1. Field of the Invention

The present invention is generally directed toward waveform shaping for input/output devices. More specifically, the present invention relates to controllably enhancing slew of a driver to shape an output signal of the driver.

2. Discussion of Related Art

Electronic devices usually exchange signals over a bus structure. A transmitting device applies (or drives) signals onto a bus signal path using an output signal driver circuit and a receiving device receives that signal through a input signal receiver circuit. As the applied signal electronically (or optically) transfers over the medium of the interconnecting bus, some signal distortion may occur. Often, such distortion may start at the signal generated by the output driver circuit and further deteriorates as the signal traverses the bus structure signal pathway.

One common bus structure for connecting peripheral I/O devices to a computer system is the Universal Serial Bus. Universal Serial Bus (USB) is a common standard in the computer industry for transferring data between computers and peripheral devices. The most widely used USB standards, such as the USB Specification 1.1 and the USB Specification 2.0, allow for data to be transferred at rates much faster than those previously achieved with typical serial or parallel ports of a personal computer. USB also provides a simple, serial data bus capable of communicating with a wide variety of devices while simplifying cabling requirements in a system. USB further provides power and "hot swapping" capabilities to many peripherals. Hot swapping is the ability to add and remove devices connected to a computer while the computer is running such that the operating system of the computer automatically recognizes the change. For example, with a USB connection, a digital camcorder can transfer digital video data from the camcorder to a computer simply by connecting the camcorder to the computer via a USB cable. The operating system automatically detects the USB connection to the camcorder and optionally supplies power to the camcorder. The digital video data is then transferred to the computer via the USB cable at the user's discretion.

The USB standards, at present, define a "low speed" transfer with signals clocked at about 1 Mhz, a "full speed" transfer with signals clocked at about 12 Mhz and a "high speed" transfer with signals clocked at about 480 Mhz. The low and full speed transfer signaling protocols are similar while the high speed signaling protocol and associated circuits adhere to a substantially different signal timing standard. While transfer speed is an important concern when designing such devices, signal quality is essential to maintaining information integrity as the data is transferred over the interconnecting bus structure. Circuit designers often implement complicated and expensive circuits to ensure that the information integrity is maintained or in the alternative to ensure that incorrect data can be detected and corrected. It is preferable to design a driver circuit that ensures data integrity at its source—namely at the output signal driver. In other words, the shape of a signal as generated at its source can be an important factor in data integrity problems. Further, a poorly generated signal shape can be further degraded as it is transmitted over the conductive signal paths of the interconnecting bus structure.

A common approach to assure quality signal generation is to control the "gain" of the signal representing the data as applied to an output driver. A typical output driver (as for example in USB) includes an operational amplifier coupled to the gate of an output transistor. The output transistor couples an appropriate power supply "rail" to the output signal. The output signal is typically applied to a conductive "pad" for interconnection to the associated bus structure. The operational amplifier receives a digital input signal and increases the gain of that signal by driving the gate of the output transistor such that the transistor conducts more current (i.e., increased current flow through its source and drain) to an output conductive pad than would direct application of the input signal to the output pad. Control over the increased gain generated by the operational amplifier is achieved with a feedback of the output signal to the amplifier through a capacitor. This feedback structure stabilizes the output signal and hence "controls" the output signal shape.

However, present output drivers have failed in delivering "high" quality signals while maintaining lower power requirements. A problem in delivering a high quality signal from the typical output driver resides in the driver's inadequacy to quickly drive the output transistor. The operational amplifier drives the output transistor such that the operational amplifier maintains control of the output signal. Unfortunately, the "slew rate" of the operational amplifier is slow in driving the gate of the output transistor. The slew rate is the rate of change of the output voltage of the operational amplifier when an input signal is applied to its input. In other words, when a voltage is applied to an input, the operational amplifier will respond by generating an output drive signal to the gate of the output transistor that changes (rises or falls) over some period of time. If the gate voltage of the output transistor rises too slowly, the signal on the output pad may briefly float uncontrolled and hence provide a poorly shaped signal on the output pad. This brief uncontrolled time for the slew of the output signal results in a poor signal shape at the output pad. Increasing the slew rate of the signal applied to the gate of the output transistor improves the shape of the output signal of the driver as applied to the output pad by reducing the time that the signal on the output pad floats uncontrolled.

The slew rate of the signal applied to the output transistor gate is, at present, a function of the operational amplifier design and the capacitive feedback circuit used to control the operational amplifier output signal. The slew rate of the feedback controlled operational amplifier is approximately inversely proportional to the size of the capacitor used in the feedback to the operational amplifier. For example, when an input signal is applied to the operational amplifier, the output signal will respond at a rate substantially determined by the size of the capacitor. Thus, to change the slew rate, one could simply change the size of the capacitor. However, such a change to the capacitor affects the stability and power consumption of the output driver.

Some approaches attempt to improve this condition by increasing the Direct Current (DC) of the operational amplifier to thereby increase its slew rate. This approach allows the amplifier to quickly pull its output to a level that quickly restores the feedback loop to its desired operating level. These approaches may increase power requirements due to large Direct Current (DC) bias currents within the operational amplifier; they may also cause instability problems because of poor settling performance and ringing because of excessive bandwidth of the operational amplifier.

Other approaches include clamping the control terminal of the output transistor to a voltage that turns on the transistor. These approaches eliminate the need for a large slewing current but are dangerous because the output transistor will remain undesirably driven at all times. Each of these solutions has unwanted effects that undermine the goals of providing a high quality output signal.

These problems and prior solutions are typical of USB output driver circuits but are also common in other signaling standards and protocols.

It is evident from the above discussion that there is a need to provide a simple output driver that maintains control of the slew of an output signal without consuming inordinate amounts of power.

SUMMARY OF THE INVENTION

The present invention solves the above and other problems and advances the state of the useful arts by providing apparatus and methods for enhanced slew control of output signals. An output driver receives an input signal and controllably increases the gain of that signal to provide a high quality output signal for use by an electronic device coupled thereto. The output driver may include an operational amplifier that maintains stability of the output signal through a feedback of the output signal. A control circuit supplies a signal to the output of the operational amplifier such that an output transistor turns on more rapidly and improves the shape of the output signal. Once the operational amplifier gains control over the output transistor, the control circuit disengages until needed again. One embodiment of the present invention may be particularly useful as a USB output driver for slow and full speed applications.

In one exemplary preferred embodiment of the invention, a circuit enhances the output signal and includes a driver circuit coupled for receiving a logical input signal and for providing an output signal representative of the input signal such that the output signal is controllable. The circuit also includes a control circuit operating in response to receiving the logical input signal for providing a control signal to the driver circuit to improve the shape of the output signal while the driver circuit substantially maintains control of the output signal.

One feature of the invention provides a circuit for improving an output signal, including: a driver circuit coupled for receiving a logical input signal and for providing the output signal representative of the input signal such that the output signal is controllable; and a control circuit operating in response to receiving the logical input signal for providing a control signal to the driver circuit to improve the shape of the output signal while the driver circuit substantially maintains control of the output signal.

In another aspect of the invention the driver circuit includes: a first switch having a control terminal coupled to receive the input signal; a current source having a first conduction terminal coupled to a first conduction terminal of the first switch and a second conduction terminal coupled for receiving a reference potential; an operational amplifier having a non-inverting input coupled to a second conduction terminal of the switch and an output coupled for providing a drive signal; a capacitor having a first conduction terminal coupled for receiving a feedback of the output signal and a second conduction terminal coupled to the non-inverting input of the operational amplifier; and a second switch having a control terminal coupled for receiving the drive signal to provide the output signal.

In another aspect of the invention, the control circuit includes: a slew circuit operating in response to receiving the input signal to provide a slew circuit drive signal; and a first switch having a control terminal coupled for receiving the slew circuit drive signal to provide the control signal to the driver circuit.

In another aspect of the invention, the slew circuit includes: an inverter operating in response to receiving the input signal; a second switch having a control terminal coupled to an output of the inverter, a first conduction terminal coupled for receiving a reference potential, and a second conduction terminal coupled for providing a slew circuit control signal; and a logic gate having a first input coupled to the output of the inverter, a second input coupled for receiving the slew circuit control signal, and an output coupled for providing the slew circuit drive signal.

In another aspect of the invention, the slew circuit includes a second switch having a control terminal coupled for receiving the control signal to disengage the slew circuit.

Another feature of the invention provides a circuit for receiving an input signal and driving an output pad, including: a first switch circuit for applying a first output signal to the output pad in response to receiving a first drive signal; driver circuit for generating a second output signal in response to receiving the input signal; a slew enhancement circuit for generating a third output signal in response to receiving the input signal; and a combiner circuit for combining the second and third output signals for application to the first drive signal to improve a shape of the first output signal.

In another aspect of the invention, the driver circuit includes: a second switch circuit having a control terminal coupled to receive the input signal; a current source having a first conduction terminal coupled to a first conduction terminal of the first switch and a second conduction terminal coupled for receiving a reference potential; an operational amplifier having a non-inverting input coupled to a second conduction terminal of the switch and an output coupled for generating the second output signal to the combiner circuit; and a capacitor having a first conduction terminal coupled for receiving a feedback signal from the pad and a second conduction terminal coupled to the non-inverting input of the operational amplifier.

In another aspect of the invention the slew enhancement circuit includes: a slew circuit operating in response to receiving the input signal to provide a slew circuit drive signal; and a third switch circuit having a control terminal coupled for receiving the slew circuit drive signal for generating the third output signal.

In another aspect of the invention the slew drive circuit includes: an inverter operating in response to receiving the input signal; a fourth switch circuit having a control terminal coupled to an output of the inverter, a first conduction terminal coupled for receiving a reference potential, and a second conduction terminal coupled for providing a slew circuit control signal; and a logic gate having a first input coupled to the output of the inverter, a second input coupled for receiving the slew circuit control signal, and an output coupled for providing the slew circuit drive signal.

In another aspect of the invention, the slew drive circuit includes a fourth switch circuit having a control terminal coupled for receiving the first drive signal to disengage the slew circuit when a predetermined value of the first output signal is obtained.

In another aspect of the invention the combiner circuit includes a node coupled for summing the second and third output signals for application to the first drive signal.

Another feature of the invention provides a method of driving an output pad, including: receiving an input signal;

controllably amplifying the input signal to provide an output signal; and boosting the output signal by providing a slew enhancement control signal to the output signal.

Another aspect of the invention includes a step of disengaging the step of increasing when a predetermined value of the output signal is obtained.

In another aspect of the invention, the step of boosting includes a step of providing a slew drive signal in response to receiving the input signal to boost the output signal.

BRIEF DESCRIPTION OF THE PREFERRED EMBODIMENTS

DETAILED DESCRIPTION OF THE PREFERRED EMBODIMENTS

While the invention is susceptible to various modifications and alternative forms, a specific embodiment thereof has been shown by way of example in the drawings and will herein be described in detail. Those skilled in the art will appreciate that the features described below can be combined in various ways to form multiple variations of the invention. As a result, the invention is not limited to the specific examples described below, but only by the claims and their equivalents.

Figure 1:
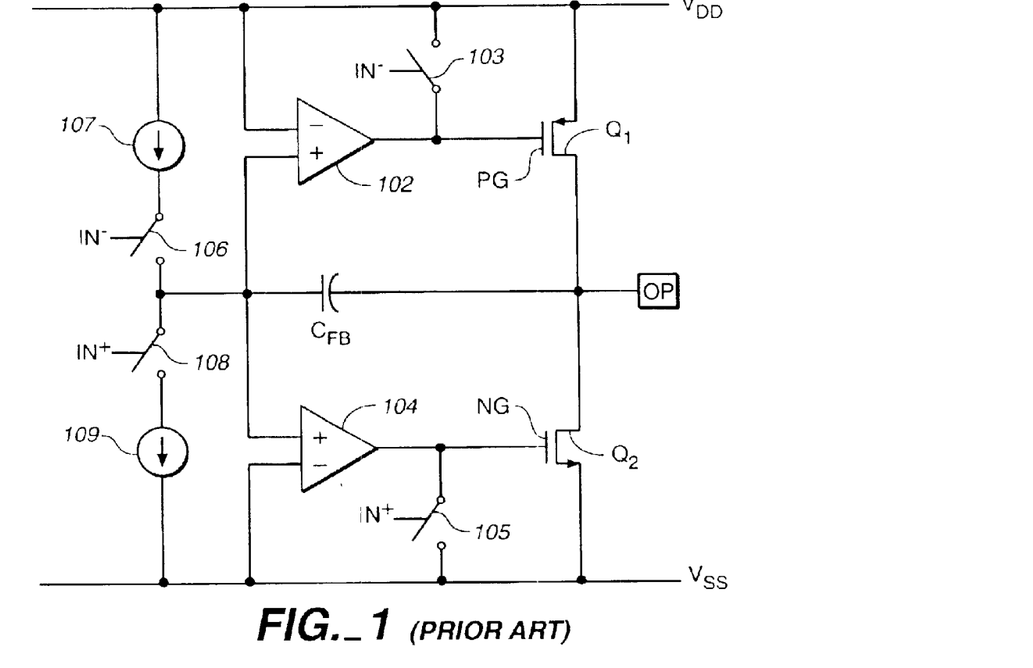
FIG. 1 is a schematic diagram illustrating a prior art output driver circuit.

With reference now to FIG. 1, a prior art output driver circuit for transferring logical data (e.g., digital data) to an output pad OP is shown in circuit 100. Circuit 100 is coupled to receive a logical signal at inputs IN⁺ and IN⁻ where the input signal applied to input IN⁺ is a digital signal and the input signal applied to input IN⁻ is the complement of that logical signal. The input IN⁺ is coupled to switch 108. A non-inverting input of amplifier 102 is coupled to an output terminal of current source 109 through switch 108. Switch 108 is any suitable switching device including, for example, a Metal Oxide Semiconductor Field Effect Transistor (MOSFET). The non-inverting input of amplifier 102 is also coupled for receiving a feedback of the output signal from the output pad OP through capacitor $C_{FB}$. An output of the amplifier 102 is coupled to drive a gate terminal of output P-type MOSFET Q1 with a drive signal PG to provide the logical high portion of the output signal to the output pad OP. The output of amplifier 102 is also coupled to switch 103, which is controlled by the input signal applied to the IN⁻ terminal.

The input IN⁻ is coupled to switch 106. A non-inverting input of amplifier 104 is coupled to an output terminal of current source 107 through switch 106. Switch 106 is any suitable switching device including, for example, a MOS-FET. The non-inverting input of the amplifier 104 is also coupled for receiving a feedback of the output signal from the output pad OP through capacitor $C_{FB}$. An output of the amplifier 104 is coupled to drive a gate terminal of the input N-type MOSFET Q2 with a drive signal NG to provide the logical low portion of the output signal to the output pad OP. The output of amplifier 104 is also coupled to switch 105, which is controlled by the input signal applied to the IN⁺ terminal.

Figure 7:
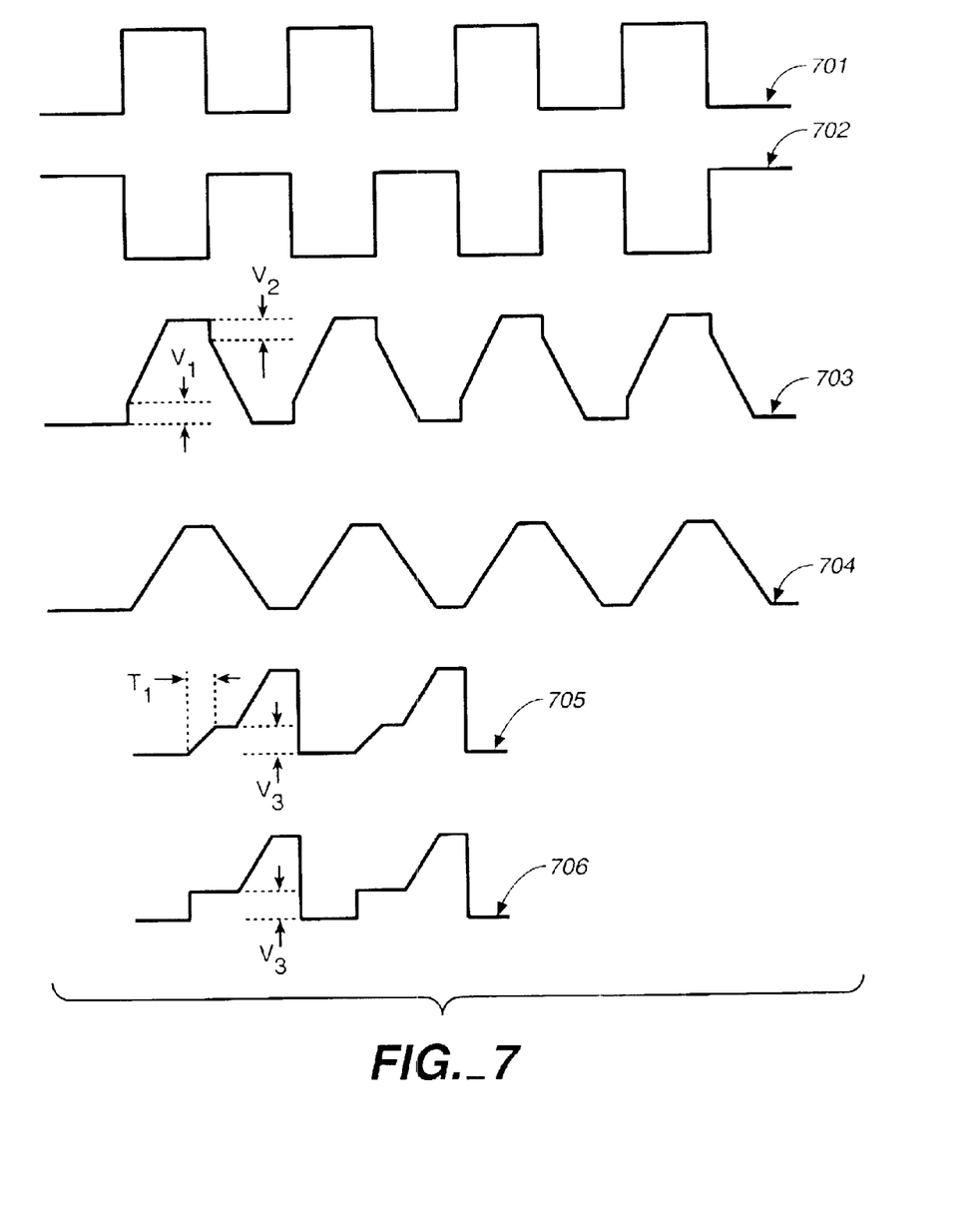
FIG. 7 shows timing diagrams of driver circuits described herein.

As circuit 100 receives the input signal, the circuit produces an output signal for output pad OP. For example, as the IN⁺ terminal begins to rise in voltage from the applied input signal, switch 106 opens and switch 108 closes such that the operational amplifier 102 outputs a corresponding negative voltage to drive output transistor Q1. As the operational amplifier 102 drives the output transistor Q1, the transistor turns on and supplies a voltage $V_{DD}$ to the output pad OP. Operational amplifier 104 operates in a similar manner such that the output transistor Q2 supplies a voltage $V_{SS}$ when the input IN⁻ begins to rise in voltage from the applied input signal (i.e., the complement of the input signal begins to transition from low to high). The maximum rate at which the amplifiers 102 and 104 change their respective voltages in response to receiving the input signal is known as the slew rate of the amplifier. This slew rate is approximately proportional to the DC current out of the operation amplifiers and approximately inversely proportional to the output capacitance. Improving the slew rate of the amplifiers improves the overall data transition performance of the circuit 100. Timing diagrams of the input signals, output signals, and drive signals are shown in FIG. 7.

Figure 5:
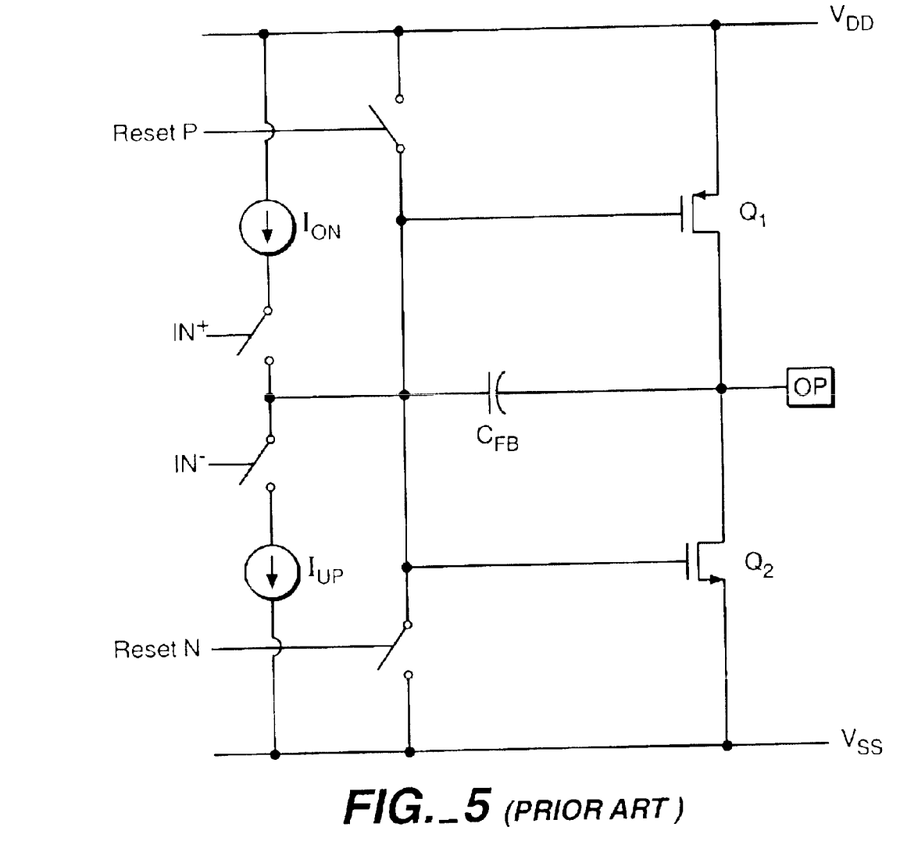
FIG. 5 is a schematic diagram of another prior art output driver circuit.
Figure 6:
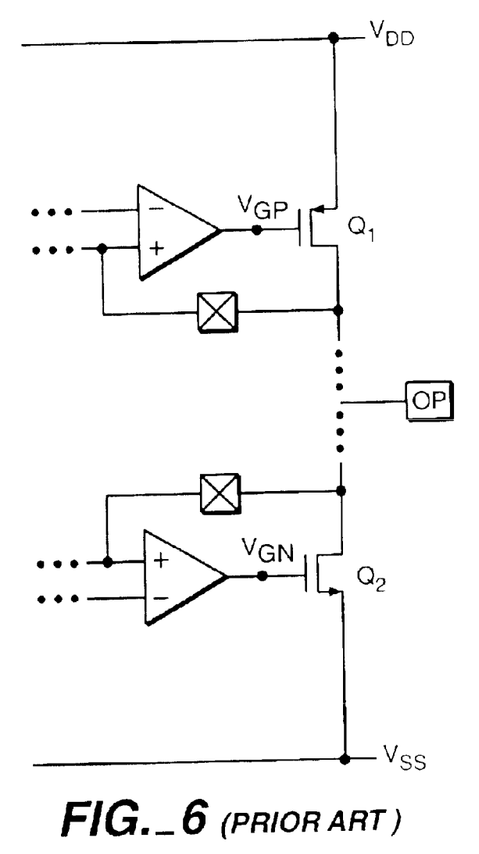
FIG. 6 is a diagram illustrating a generalized circuit for driving a signal to either of two logic levels as known in the prior art.

FIG. 5 and FIG. 6 depict other variants of a typical prior art driver circuit where slew rate improvements may be applied. FIG. 5 is a driver circuit similar to FIG. 1 where operational amplifiers are not used. FIG. 6 is a common circuit structure to drive an output pad "OP" to either of two logic levels using operational amplifiers with a feedback circuit function "X" (indicating any appropriate feedback logic and timing). All such circuits known in the prior art may beneficially apply the slew enhancement structures and methods of the present invention as discussed herein below.

Figure 2:
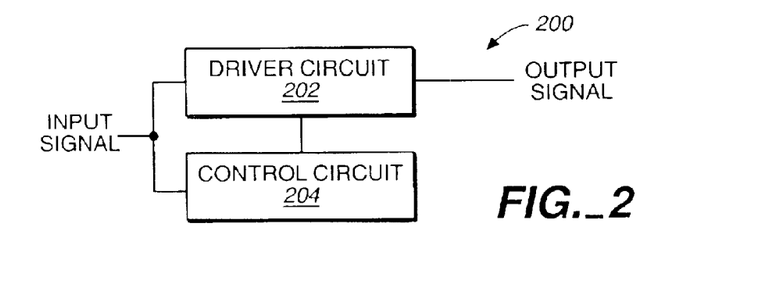
FIG. 2 is a block diagram illustrating an exemplary preferred embodiment of the invention.

With reference now to FIG. 2, an exemplary preferred embodiment of the invention is shown in system 200. System 200 is configured to enhance the output signal. System 200 is configured for transferring data to a device coupled thereto. System 200 includes a driver circuit 202 coupled for receiving a logical input signal and for providing an output signal representative of the input signal such that the output signal is controllable. System 200 also includes a control circuit 204 operating in response to receiving the logical input signal for providing a control signal to driver circuit 202 to improve the shape of the output signal while driver circuit 202 substantially maintains control of the output signal. This embodiment as well as other embodiments discussed herein may be particularly useful as a USB output driver. Those skilled in the art will understand that other embodiments that fall within the scope of the invention may be fashioned to operate in response to receiving an input signal to provide a control signal for shaping an output signal.

Figure 3:
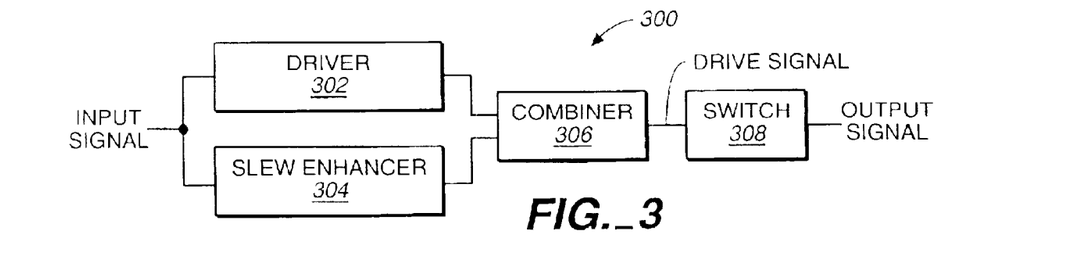
FIG. 3 is a block diagram illustrating another exemplary preferred embodiment of the invention.

FIG. 3 shows another exemplary preferred embodiment of the invention in system 300. System 300 includes a driver 302 for generating an output signal in response to receiving an input signal. System 300 also includes a slew enhancer 304 for generating another output signal in response to receiving the input signal. A combiner 306 receives the output signals of the driver and the slew enhancer and combines the two signals for application to a drive signal. The drive signal is applied to switch 308 such that when switch 308 receives the drive signal, the switch 308 applies an output signal to an output pad. The drive signal, as derived from the combined output signals of the driver and the slew enhancer, improves the shape of the output signal of the to the output pad. The output pad is used for transferring the output signal to a device coupled thereto.

Figure 4:
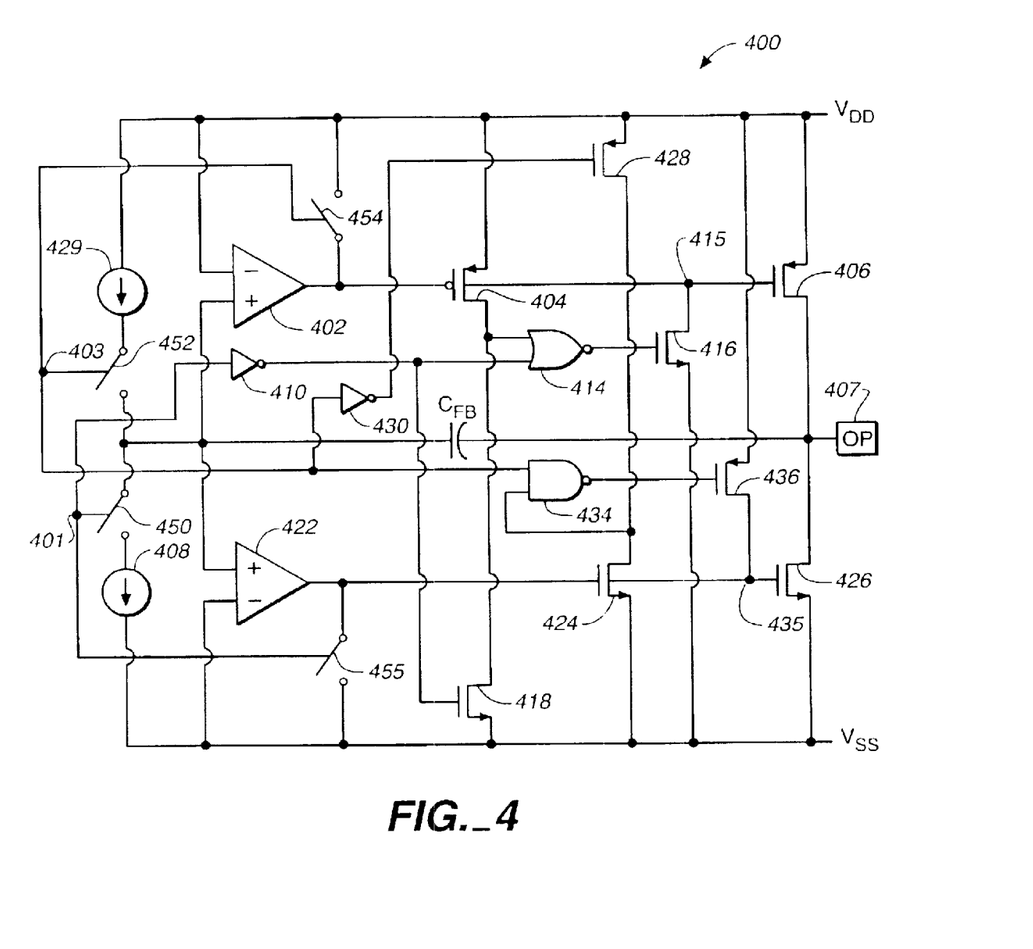
FIG. 4 is a schematic diagram illustrating an exemplary preferred output driver circuit in one embodiment of the invention.

FIG. 4 shows a schematic diagram illustrating an exemplary preferred output driver circuit 400 in one embodiment of the invention. Circuit 400 is coupled for receiving an input signal at terminals 401 and 403. The input signal may be a logical signal (e.g., a digital signal) conducted to terminal 401 and the complement of that logical signal conducted to terminal 403. Those of ordinary skill in the art will recognize a wide variety of equivalent signals that may be applied as an input to the output driver circuit. Circuit 400 receives the input signal and controllably increases the gain of the input signal to provide an output signal applied to output pad 407.

The circuit 400 can be thought of as comprising two sections, a logical high section for driving a high signal onto output pad OP and a logical low section for driving a low signal onto output pad OP. The logical high section includes an operational amplifier 402 coupled for providing a drive signal to P-type MOSFET 406. A non-inverting input of amplifier 402 is switchably coupled through switch 450 to an output terminal of current source 408. Switch 450 may be any suitable switching device including, for example, a MOSFET. The non-inverting input of amplifier 402 is also coupled for receiving a feedback of the output signal from output pad 407 through capacitor $C_{FB}$. An inverting input of operational amplifier 402 is coupled to receive a voltage $V_{DD}$. An output of amplifier 402 is coupled to a control terminal of the output MOSFET 406 to drive the MOSFET so as to provide the logical high portion of the output signal to the output pad 407. The output of amplifier 402 is also coupled to switch 454, which is controlled by the input signal applied to terminal 403. Switch 454 provides a rapid "disconnect" of the logical level high to output pad 407 when transitioning to the logical level low. In another exemplary preferred embodiment, switch 454 could be included in operational amplifier 402; it is shown outside of operational amplifier 402 in this embodiment to illustrate how the output signal to output pad 407 may be rapidly disconnected.

The logical low section is similar to the logical high section and accordingly includes an operational amplifier 422 coupled for providing a drive signal to N-type MOSFET 426. A non-inverting input of amplifier 422 is switchably coupled through switch 452 to an output terminal of current source 429. Switch 452 may be any suitable switching device including, for example, a MOSFET. The non-inverting input of amplifier 422 is also coupled for receiving a feedback of the output signal from output pad 407 through capacitor $C_{FB}$. An inverting input of operational amplifier 422 is coupled to receive a voltage $V_{ss}$. An output of amplifier 422 is coupled to a control terminal of the output MOSFET 426 to drive the MOSFET so as to provide the logical low portion of the output signal to the output pad 407. The output of amplifier 422 is also coupled to switch 455, which is controlled by the input signal applied to terminal 401. Switch 455 provides a rapid "disconnect" of the logical level low to output pad 407 when transitioning to the logical level high. In another exemplary preferred embodiment, switch 455 could be included in operational amplifier 422; it is shown outside of operational amplifier 422 in this embodiment to illustrate how the output signal to output pad 407 may be rapidly disconnected.

As circuit 400 receives the input signal, the circuit produces an output signal for output pad 407. For example, in the logical high section, when the input signal is applied and the voltage at terminal 401 begins to rise due to a transition from logical low to logical high of the input signal, switch 452 opens and switch 450 closes thereby supplying current from current source 408 to operational amplifier 402. Operational amplifier 402 correspondingly decreases voltage to drive output MOSFET 406. As the amplifier 402 drives the output MOSFET 406, the MOSFET 406 turns on and supplies the voltage $V_{DD}$ to the output pad 407. The output signal of the amplifier 402 is increased through the use of slew enhancement control circuitry to boost the output signal such that MOSFET 406 turns on faster.

The slew enhancement control circuitry related to the logical high section includes an inverter 410 having an input coupled for receiving the input signal from the terminal 401. An output of the inverter 410 is coupled to an input of a logical NOR gate 414. The output of the inverter 410 is also coupled to a gate terminal of N-type MOSFET 418 such that when the inverter 410 applies a signal to a gate terminal of the MOSFET 418, the MOSFET 418 supplies a control signal to a second input of the logical NOR gate 414. The logical NOR gate 414 in turn supplies a slew drive signal to a gate of N-type MOSFET 416. The N-type MOSFET 416 accordingly responds by supplying a slew enhancement control signal to node 415 to control the gate of output MOSFET 406. A gate of P-type MOSFET 404 is also connected for being driven by operational amplifier 402 and for receiving the slew enhancement control signal supplied to node 415. P-type MOSFET 404 has substantially the same W over L ratio as output MOSFET 406 thereby having approximately the same saturation voltage level. Further, both of MOSFETs 404 and 406 may be much greater in size than N-type MOSFET 418.

Operation of the logical high section is as follows. As the input signal transitions from a logical level low to a logical level high at input terminal 401, the output signal of the inverter 410 proceeds to a logical level low for application to the logical NOR gate 414. The logical NOR gate 414 logically NOR combines the output signal of the inverter 410 with a logical low since the MOSFET 418 was originally turned on and the MOSFET 404 was originally turned off. The output of the inverter 410 thus turns the MOSFET 418 off but not prior to allowing the logical low signal to be supplied to the NOR gate 414. The logical NOR gate 414 outputs a logical high drive signal to the gate of MOSFET 416 that, in turn, provides a large current draw to lower node 415 to its DC operating point. At this point node 407 (output pad) will have a slew rate of $I/C_{FB}$ where I is the current supplied by current source 408. The application of the slew enhancement control signal as applied to the gate of MOSFET 406, thus, provides a smoother transition of the output signal from the logical low to the logical high. When MOSFET 404 turns on, the signal that is supplied from the MOSFET 404 disengages the slew enhancement control circuitry by providing a logical high to the logical NOR gate 414 since the size of MOSFET 404 is typically larger than the size of MOSFET 418. Logical NOR gate 414 logically NOR combines the logical high supplied by MOSFET 404 with the logical low from the inverter 410 to turn off MOSFET 416 and accordingly disengage the slew enhancement control circuitry.

Operating similarly to the logical high section, when the compliment input signal is applied to the logical low section and the voltage at terminal 403 begins to rise (i.e., the voltage of the input signal at terminal 401 begins to fall), switch 450 opens and switch 452 closes thereby supplying current from current source 429 to operational amplifier 422. Operational amplifier 422 correspondingly increases voltage to drive output MOSFET 426. As the amplifier 422 drives the output MOSFET 426, the MOSFET turns on and supplies a voltage $V_{SS}$ to the output pad 407. The output signal of the amplifier 422 is also increased through the use of slew enhancement control circuitry to boost the output signal such that MOSFET 426 is turns on faster.

The slew enhancement control circuitry related to the logical low section includes an inverter 430 having an input coupled for receiving the input signal from terminal 403. An output of the inverter 430 is coupled to a gate of P-type MOSFET 428. MOSFET 428 conducts a control signal to a logical NAND gate 434. The logical NAND gate 434 also directly receives the input signal from terminal 403 and logically NAND combines the two signals to supply a slew drive signal to a gate of P-type MOSFET 436. P-type MOSFET 436 accordingly responds by supplying a slew enhancement control signal to node 435 to control the gate of output MOSFET 426. A gate of N-type MOSFET 424 is also connected for being driven by the operational amplifier 422 and for receiving the slew enhancement control signal supplied to node 435. N-type MOSFET 424 may be approximately the same size as output MOSFET 426 with both of MOSFETs 424 and 426 being typically much greater in size than N-type MOSFET 428.

Operation of the logical low section is as follows. As the compliment input signal is about to transition from a logical level low to a logical level high at input terminal 403, inverter 430 applies a logical level low output signal to a the gate of MOSFET 428 and proceeds to turn MOSFET 428 on applies a logical high input to NAND gate 434. The input signal is directly applied to the logical NAND gate 434, which is logically NAND combined with the logical high supplied from MOSFET 428. The logical NAND gate 428 outputs a logical low drive signal to the gate of MOSFET 436 that, in turn, provides a large current draw to raise node 435 to its DC operating point. At this point node 407 (output pad) will have a slew rate of $I/C_{FB}$ where I is the current supplied by current source 429. The application of the slew enhancement control signal as applied to the gate of MOSFET 406, thus, provides a smoother transition of the output signal from the logical high to the logical low. When MOSFET 424 turns on, the signal that is supplied from MOSFET 424 disengages the slew enhancement control circuitry by providing a logical low to the logical NAND gate 434 since the size of MOSFET 424 is typically larger than the size of MOSFET 428. Logical NAND gate 434 logically NAND combines the logical low supplied by MOSFET 424 with the logical high from the inverter 430 to turn off MOSFET 436 and accordingly disengage the slew enhancement control circuitry.

Those skilled in the art will understand that other methods can be used to implement slew enhancement of an output signal that fall within the scope of the invention. For example, other logic gates and switches (i.e., transistors) can be implemented to provide various types of drive signals and control signals that direct a circuit to operate in accord with the invention. Those skilled in the art will also understand that other types of transistors may be used and that the invention is not to be limited to the P-type and N-type MOSFETs shown in the exemplary preferred embodiments.

FIG. 7 shows timing diagrams 701–706 of some of the signals described in the detailed description. Those of ordinary skill in the art will recognize that the various timing diagrams are intended merely as exemplary of the changes in signal shaping that result from application of the present invention. The timing diagrams are therefore not intended to show precise timing relationships or precise signal levels and shapes.

Timing diagrams 701 and 702, respectively, show the input signal and the compliment of that input signal. This input signal and its compliment are respectively applied to the terminals IN− and IN+ of the prior art output driver circuit 100 of FIG. 1 as well as to input terminals 401 and 403 of output driver 400 of FIG. 4. Each of remaining timing diagrams 703–706 is positioned to illustrate an exemplary relationship to the timing of the input signals in timing diagrams 701 and 702.

Timing diagram 703 shows a waveform of an output signal as it would typically be generated in the prior art circuit of output driver circuit 100 of FIG. 1. The waveform has rapid voltage fluctuations $V_1$ and $V_2$ from respective logical level lows and highs throughout the waveform. These rapid voltage fluctuations $V_1$ and $V_2$ are caused by a lack of control between transitions of the output signal from logical low to logical high and vice versa. Transistors Q1 and Q2 being turned off at the same time cause the lack of control. For example, as circuit 100 begins a transition from logical level high to logical level low, transistor Q1 turns off. However, transistor Q2 has not yet turned on and causes the output signal to float at output pad OP, thereby creating the voltage fluctuation of $V_2$. The voltage fluctuation of $V_1$ is similarly created by transistor Q1 when transitioning from logical level low to logical level high.

One reason that transistor Q2 does not turn on fast enough is evident in timing diagram 705. Timing, diagram 705 shows a waveform of the drive signal NG as applied by operational amplifier 104 of FIG. 1. Drive signal NG has a slow "ramp up" time $T_1$ to a voltage level $V_3$, which causes transistor Q2 to be driven on at a slower rate. The slower rate translates to having both of transistors Q1 and Q2 off at the same time and the output signal to output pad OP to float. The drive signal PG as generated by operational amplifier 102 of FIG. 1 has a waveform that drives transistor Q1 in a similar manner.

Timing diagram 704 shows a waveform of an output signal as it would typically be generated in output driver circuit 400 of FIG. 4. This waveform shows no rapid voltage fluctuations such as those of $V_1$ and $V_2$. The waveform was resultantly shaped by combining the drive signal of operational amplifier 422 with the slew enhancement control signal supplied by MOSFET 436. The combination of the drive signal with the slew enhancement control signal is shown in timing diagram 706. The waveform of timing diagram 706 shows a more rapid transition from logical level low to voltage level $V_3$ that turns on MOSFET 426. The more rapid transition allows MOSFET 426 to be turned on faster than a transistor driven by the signal of timing diagram 705. The slew enhancement control circuitry generated the slew enhancement control signal so as to provide the rapid transition by boosting the drive signal of operational amplifier 422 to voltage level $V_3$ until operational amplifier 422 can turn MOSFET 426 alone. This boosting of the drive signal more rapidly turned on MOSFET 426 such that the time that MOSFETs 426 and 406 remained simultaneously off was either minimized or completely negated. The drive signal as generated by operational amplifier 402 of FIG. 4 has a waveform that drives MOSFET 406 in a similar manner.

Those of ordinary skill in the art will readily recognize that the slew enhancement features described herein above may be similarly advantageously applied to a driver circuit structure that does not use operation amplifiers or to other circuits where slew control enhancement is desirable. The embodiment shown in FIG. 4 is merely intended as one common, useful application of the features of the invention.

As noted, such a circuit may be particularly useful in high speed USB circuit applications.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A circuit for improving an output signal, including:
   a driver circuit coupled for receiving a logical input signal and for providing the output signal representative of the input signal such that the output signal is controllable; and
   a control circuit operating in response to receiving the logical input signal for providing a control signal to the driver circuit to improve the shape of the output signal while the driver circuit substantially maintains control of the output signal,
   wherein the driver circuit and the control circuit are operable in combination to controllably slow the slew rate of the output signal relative to the logical input signal,
   wherein the driver circuit includes;
   a first switch having a control terminal coupled to receive the input signal;
   a current source having a first conduction terminal coupled to a first conduction terminal of the first switch and a second conduction terminal coupled for receiving a reference potential;
   an operational amplifier having a non-inverting input coupled to a second conduction terminal of the first switch and an output coupled for providing a drive signal;
   a capacitor having a first conduction terminal coupled for receiving a feedback of the output signal and a second conduction terminal coupled to the non-inverting input of the operational amplifier; and
   a second switch having a control terminal coupled for receiving the drive signal to provide the output signal.

2. The circuit of claim 1, wherein the control circuit includes:
   a slew circuit operating in response to receiving the input signal to provide a slew circuit drive signal; and
   a first switch having a control terminal coupled for receiving the slew circuit drive signal to provide the control signal to the driver circuit.

3. The circuit of claim 2, wherein the slew circuit includes:
   an inverter operating in response to receiving the input signal;
   a second switch having a control terminal coupled to an output of the inverter, a first conduction terminal coupled for receiving the reference potential, and a second conduction terminal coupled for providing a slew circuit control signal; and
   a logic gate having a first input coupled to the output of the inverter, a second input coupled for receiving the slew circuit control signal, and an output coupled for providing the slew circuit drive signal.

4. The circuit of claim 2, wherein the slew circuit includes a second switch having a control terminal coupled for receiving the control signal to disengage the slew circuit.

5. A circuit for receiving an input signal and driving an output pad, including:
   a first switch circuit for applying a first output signal to the output pad in response to receiving a first drive signal;
   a driver circuit for generating a second output signal in response to receiving the input signal;
   a slew enhancement circuit for generating a third output signal in response to receiving the input signal; and
   a combiner circuit for combining the second and third output signals for application to the first drive signal to improve a shape of the first output signal,
   wherein the first switch circuit and the driver circuit and the slew enhancement circuit and the combiner circuit are operable in combination to controllably slow the slew rate of the first output signal relative to the input signal.

6. The circuit of claim 5, wherein the driver circuit includes:
   a second switch circuit having a control terminal coupled to receive the input signal;
   a current source having a first conduction terminal coupled to a first conduction terminal of the second switch circuit and a second conduction terminal coupled for receiving a reference potential;
   an operational amplifier having a non-inverting input coupled to a second conduction terminal of the second switch circuit and an output coupled for generating the second output signal to the combiner circuit; and
   a capacitor having a first conduction terminal coupled for receiving a feedback signal from the pad and a second conduction terminal coupled to the non-inverting input of the operational amplifier.

7. The circuit of claim 6, wherein the slew enhancement circuit includes:
   a slew circuit operating in response to receiving the input signal to provide a slew circuit drive signal; and
   a third switch circuit having a control terminal coupled for receiving the slew circuit drive signal for generating the third output signal.

8. The circuit of claim 7, wherein the slew circuit includes:
   an inverter operating in response to receiving the input signal;
   a fourth switch circuit having a control terminal coupled to an output of the inverter, a first conduction terminal coupled for receiving the reference potential, and a second conduction terminal coupled for providing a slew circuit control signal; and
   a logic gate having a first input coupled to the output of the inverter, a second input coupled for receiving the slew circuit control signal, and an output coupled for providing the slew circuit drive signal.

9. The circuit of claim 7, wherein the slew circuit includes a fourth switch circuit having a control terminal coupled for receiving the first drive signal to disengage the slew circuit when a predetermined value of the first output signal is obtained.

10. The circuit of claim 5, wherein the combiner circuit includes a node coupled for summing the second and third output signals for application to the first drive signal.

* * * * *